(12) United States Patent
Song

(10) Patent No.: US 6,583,021 B2
(45) Date of Patent: Jun. 24, 2003

(54) METHOD OF FABRICATING CAPACITOR HAVING HAFNIUM OXIDE

(75) Inventor: Chang-Rock Song, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/141,713

(22) Filed: May 9, 2002

(65) Prior Publication Data

US 2003/0003648 A1 Jan. 2, 2003

(30) Foreign Application Priority Data

Jun. 30, 2001 (KR) .................................. 2001-0038756

(51) Int. Cl.$^7$ .......................................... H01L 21/8242
(52) U.S. Cl. ........................ 438/396; 438/768; 438/244; 438/386; 148/DIG. 14
(58) Field of Search ........................ 438/244, 239, 438/386, 396, 660, 768, FOR 212, FOR 220; 148/DIG. 14

(56) References Cited

U.S. PATENT DOCUMENTS

| | | | | |
|---|---|---|---|---|
| 4,432,035 A | | 2/1984 | Hsieh et al. | |
| 4,839,011 A | * | 6/1989 | Ramalingam et al. | 204/192.38 |
| 4,920,071 A | * | 4/1990 | Thomas | 438/626 |
| 4,931,896 A | | 6/1990 | LeCourt | |
| 5,292,609 A | | 3/1994 | Yoshikawa et al. | |
| 5,414,301 A | * | 5/1995 | Thomas | 257/740 |
| 5,610,853 A | | 3/1997 | Akiyama et al. | |
| 5,641,702 A | | 6/1997 | Imai et al. | |
| 5,741,722 A | * | 4/1998 | Lee | 438/240 |
| 6,436,723 B1 | * | 8/2002 | Tomita et al. | 438/3 |
| 2001/0000923 A1 | * | 5/2001 | Takemura | 257/532 |
| 2001/0016382 A1 | * | 8/2001 | Song et al. | 438/240 |
| 2002/0028556 A1 | * | 3/2002 | Marsh et al. | 438/299 |
| 2003/0036242 A1 | * | 2/2003 | Yang | 438/396 |

FOREIGN PATENT DOCUMENTS

| | | |
|---|---|---|
| JP | 60-107588 | 11/1986 |
| JP | 63-047945 | 9/1989 |

* cited by examiner

Primary Examiner—George Fourson
Assistant Examiner—Joannie Adelle Garcia
(74) Attorney, Agent, or Firm—Marshall, Gerstein & Borun

(57) ABSTRACT

Disclosed herein is a method of fabricating a capacitor. The method includes the steps of: forming a $Ti_{1-x}Hf_xN$ layer on a substrate, wherein x is in a range from 0 to 0.5; forming an electrode layer on the $Ti_{1-x}Hf_xN$ layer; and forming a $HfO_2$ layer on an interface between the electrode layer and the $Ti_{1-x}Hf_xN$ layer by performing a thermal treatment in an oxygen gas-containing atmosphere.

17 Claims, 5 Drawing Sheets

METHOD OF FABRICATING CAPACITOR HAVING HAFNIUM OXIDE

BACKGROUND OF THE INVENTION

1. Field of the Invention

The present invention relates to a method of fabricating a semiconductor device. More particularly, the invention relates to a method for fabricating a capacitor thereof.

2. Brief Description of Related Technology

As an integration of a semiconductor device becomes higher recently, studies are conducted to increase the charge storage area by forming a capacitor in a complicated structure such as a cylinder, fin, stack or hemispheric silicon (HSG) to secure sufficient capacitance. In addition, a dielectric layer of capacitor is formed of materials $HfO_2$, $Al_2O_3$, $Ta_2O_5$, $SrTiO_3$, $(Ba,Sr)TiO_3$, BLT, etc., of which dielectric constants are higher than $SiO_2$ or $Si_3N_4$. In particular, a hafnium oxide ($HfO_2$) layer is a high dielectric layer currently studied for a gate insulation layer and a dielectric layer of a capacitor.

FIGS. 1A to 1C are cross-sectional views illustrating a conventional method for fabricating a capacitor.

Referring to FIG. 1A, an inter-layer dielectric layer (ILD) 12 is formed on a surface of a semiconductor substrate 11 having transistors and bit lines, and a storage node contact mask (not shown) is formed on inter-layer dielectric layer (ILD) 12. After that, a storage node contact hole is formed to expose a predetermined area of the surface of the semiconductor substrate 11 by etching the inter-layer dielectric layer 12 with the storage node contact mask.

Subsequently, a polysilicon layer is formed on the entire surface including the storage node contact hole, and then an etch-back process is carried out in order to form a polysilicon plug 13 in the contact hole to a predetermined depth.

After that, a titanium silicide ($TiSi_2$) 14 and a titanium nitride (TiN) layer 15 are formed on the polysilicon plug 13. The $TiSi_2$ layer 14 forms an ohmic contact with a following bottom electrode, and the TiN layer 15 serves as an anti-diffusion layer that prevents oxygen remaining inside the bottom electrode from diffusing into the polysilicon plug 13, the storage node contact plug, or into the semiconductor substrate 11.

Referring to FIG. 1B, a sacrificial oxide layer 16 that determines the height of the bottom electrode is formed on the inter-layer dielectric layer 12 and the TiN layer 15, and then a storage node mask (not shown) using a photoresist is formed on the sacrificial oxide layer 16.

Subsequently, the sacrificial oxide layer 16 is selectively etched with the storage node mask to form an opening in which a bottom electrode is aligned on the polysilicon plug 13 to be formed.

Thereafter, a bottom electrode 17 is formed of metal over the surface of the sacrificial oxide layer 16 including the opening. After that, the bottom electrode is made to remain in the opening only through the process of etch-back or chemical mechanical polishing method so that the bottom electrode in the concavity is isolated from the neighboring bottom electrodes.

Referring to FIG. 1C, on the entire surface including the bottom electrode 17, a dielectric layer 18 and a top electrode 19 are formed successively. Here, the bottom electrode 17, dielectric layer 18 and top electrode 19 are formed by the chemical vapor deposition (CVD) method, and the dielectric layer 18 is mostly made of a high dielectric layer, such as $HfO_2$.

In the conventional method described above, a capacitor is formed connected to a plug by using a storage node contact mask.

However, in a dynamic RAM (DRAM) over 4 Gbits that a fine design rule should be applied to, the storage node contact plug and the bottom electrode should not be misaligned. Also, to secure a sufficient capacitance, the height of the bottom electrode should be increased. This is a difficult because the plug height for interconnection becomes higher as the height of the bottom electrode gets higher. In addition, because the isolation gap from the neighboring bottom electrode is reduced, the current technology forming a bottom electrode, dielectric layer and top electrode by the CVD method has reached its limitation, so an atomic layer deposition (ALD) method is under development recently.

However, the ALD method has a shortcoming that an extra thermal treatment, or plasma treatment should be performed in every step to improve the quality of the layers. This is because the ALD method conducts depositions at a low temperature to improve the step coverage. Due to such complicated processes and investment for new equipments, the production costs are high for the ALD method.

It would be desirable to provide a method for fabricating a capacitor that avoids a rise in the production cost and complexity in production processes caused by performing a deposition and a subsequent treatment thereof whenever a layer is formed.

It also would be desirable to provide a method for fabricating a capacitor that avoids a misalignment in masking or etching processes for connecting transistors and the capacitor.

SUMMARY OF THE INVENTION

Accordingly, disclosed herein is a method of fabricating a capacitor, comprising the steps of: (a) forming a $Ti_{1-x}Hf_xN$ layer on a substrate, wherein x is in a range from 0 to 0.5; (b) forming an electrode layer on the $Ti_{1-x}Hf_xN$ layer; and, (c) forming a $HfO_2$ layer on an interface between the electrode layer and the $Ti_{1-x}Hf_xN$ layer by performing a thermal treatment in an oxygen gas-containing atmosphere. Such a capacitor will include a bottom electrode formed from the $Ti_{1-x}Hf_xN$ layer, a dielectric layer formed from the $HfO_2$ layer, and a top electrode formed from the electrode layer.

Also disclosed herein is a method for fabricating a capacitor, comprising the steps of: (a) forming an inter-layer dielectric layer on a silicon semiconductor substrate; (b) forming a contact hole that exposes a surface of the semiconductor substrate by selectively etching the inter-layer dielectric layer; (c) forming a $Ti_{1-x}Hf_xN$ layer in the contact hole, wherein x is in a range from 0 to about 0.5; (d) forming an electrode layer on the $Ti_{1-x}Hf_xN$ layer; and forming a $HfO_2$ layer on an interface between the electrode layer and the $Ti_{1-x}Hf_xN$ layer by performing a thermal treatment in an oxygen atmosphere. Such a capacitor will include a bottom electrode formed from the $Ti_{1-x}Hf_xN$ layer, a dielectric layer formed from the $HfO_2$ layer, and a top electrode formed from the electrode layer.

BRIEF DESCRIPTION OF THE DRAWING FIGURES

Additional features of the invention will become apparent from the following description of the preferred embodiments taken in conjunction with the appended claims and the accompanying drawings, in which:

DETAILED DESCRIPTION OF THE PREFERRED EMBODIMENTS

Figure 1A:
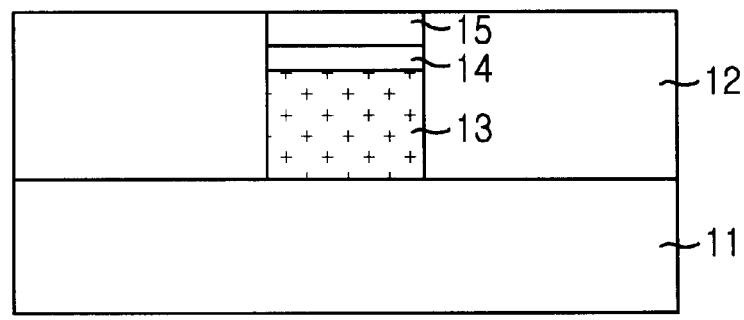
FIGS. 1A to 1C are cross-sectional views illustrating a conventional method for fabricating a capacitor.
Figure 1B:
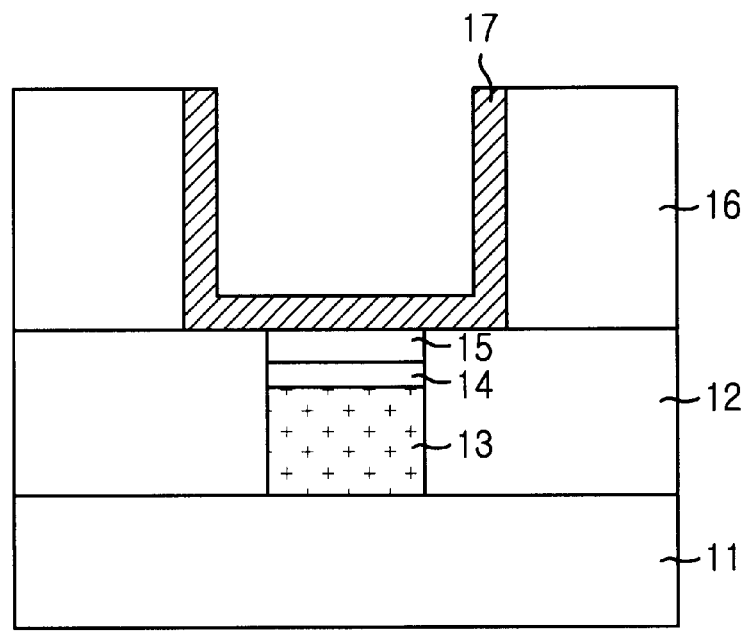
Figure 1C:
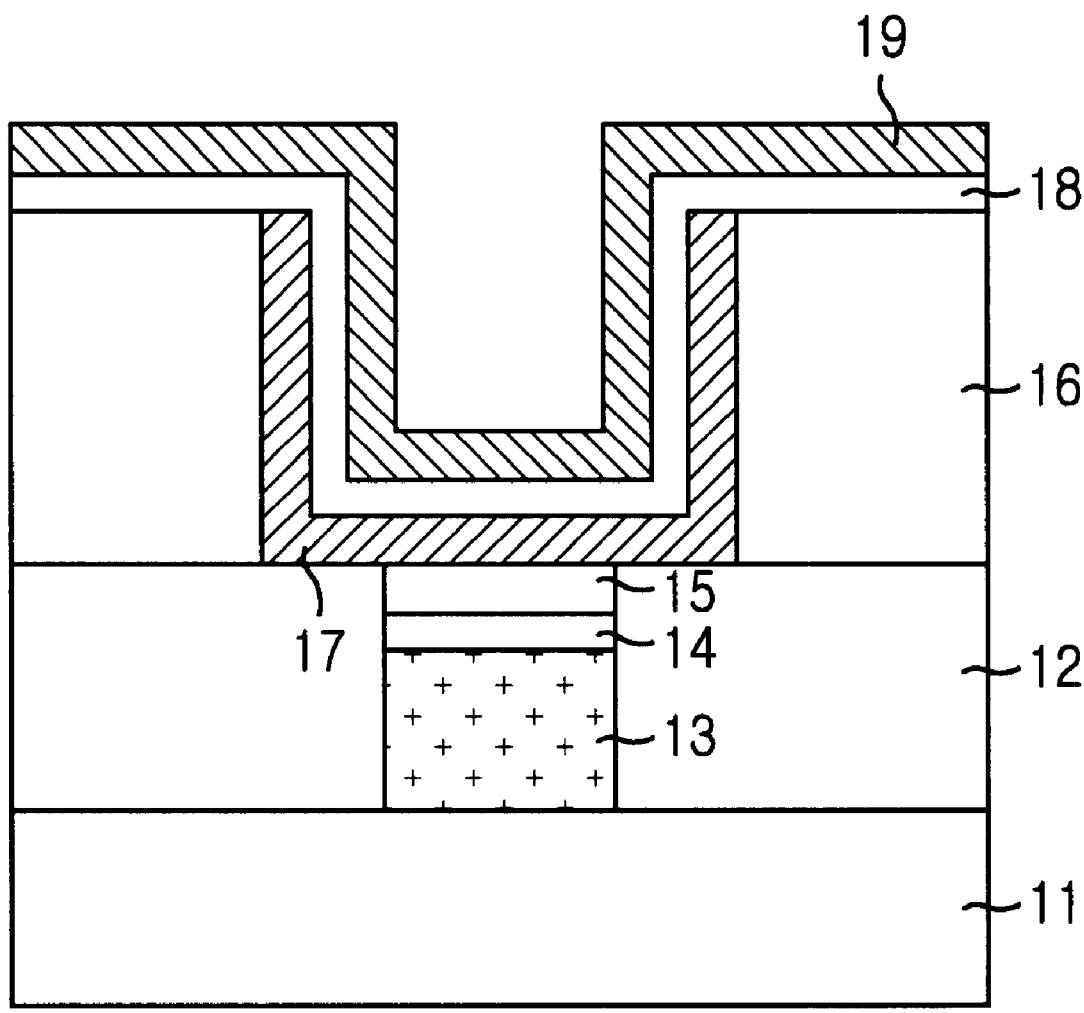
Figure 2A:
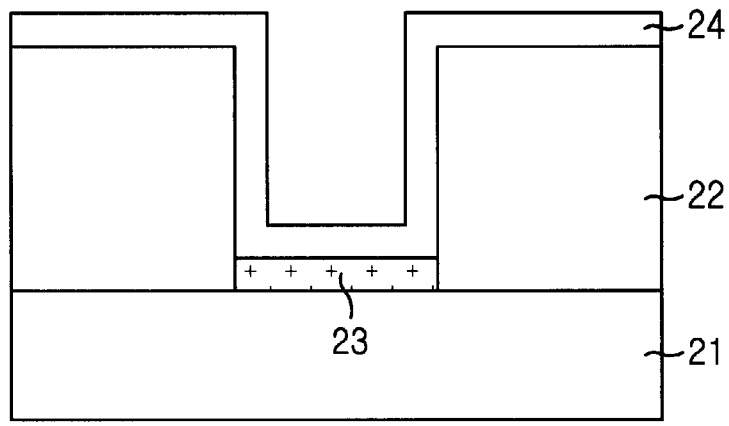
FIGS. 2A to 2C are cross-sectional views depicting a method for fabricating a capacitor in accordance with an embodiment of the present invention; and, FIG. 3 is a graph showing a phase stability of $TiO_2$ and $HfO_2$.

Referring to FIG. 2A, an inter-layer dielectric layer 22 is deposited on a semiconductor substrate 21 having transistors and bit lines to insulate the substrate 21 from a capacitor to be formed subsequently. Thereafter, a storage node contact mask (not shown) is formed on the inter-layer dielectric layer 22 by using a photoresist. The inter-layer dielectric layer 22 is formed with an oxide layer to a thickness of about 5000 Å to about 20000 Å.

Subsequently, a storage node contact hole is formed to expose a predetermined part of the semiconductor substrate 11 by etching the inter-layer dielectric layer 22 with the storage node contact mask. Here, the storage node contact hole can be formed in a shape of a circle, stick, rectangle or polygon.

Thereafter, a titanium layer is deposited on the entire surface including the storage node contact hole. After performing a rapid thermal process (RTP), an ohmic layer 23 of titanium silicide ($TiSi_2$) is formed on the exposed semiconductor substrate 21 in the storage node contact hole to improve the contact resistance between the substrate 21 and a bottom electrode to be formed. The titanium layer is deposited by a method of sputtering, a chemical vapor deposition (CVD), or an atomic layer deposition (ALD) to a thickness of about 100 Å to about 500 Å. The rapid thermal process for forming the titanium silicide ($TiSi_2$) 23 is performed in a nitrogen or argon atmosphere at a temperature of about 700° C. to about 900° C. for about 10 seconds to about 180 seconds. After that, non-reacted titanium is removed by wet-etching with ammonium hydroxide or sulphuric acid. At this moment, the wet-etching is carried out for about one minute to about 40 minutes. Meanwhile, after the deposition of titanium layer, an extra layer of titanium nitride (TiN) can be formed to a thickness of about 100 Å to about 500 Å by sputtering, CVD, or ALD methods.

After removing any non-reacted titanium, a $Ti_{1-x}Hf_xN$ layer 24 layer is formed by a sputtering, CVD, or ALD method, to a thickness of about 100 Å to about 300 Å. In case of depositing $Ti_{1-x}Hf_xN$ layer 24 by the CVD or ALD methods, it can be deposited by gradually increasing the molar fraction of Hf relative to TiN to $Ti_{0.5}Hf_{0.5}N$.

Figure 2B:
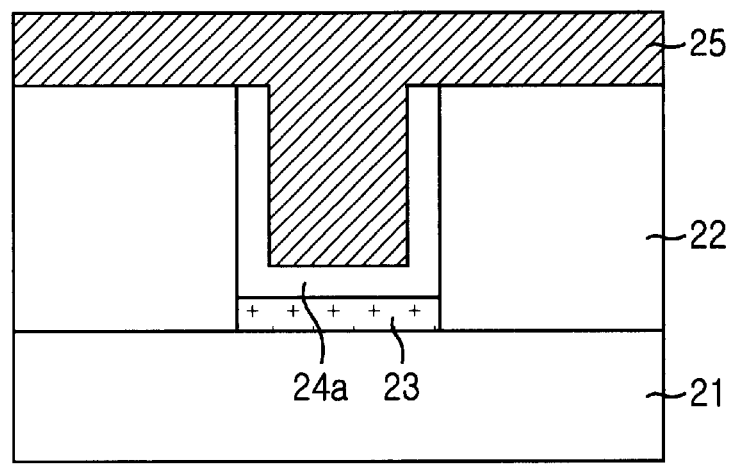

Referring to FIG. 2B, a $Ti_{1-x}Hf_xN$ layer 24a is made to remain only in the storage node contact hole by removing the $Ti_{1-x}Hf_xN$ layer 24 from the inter-layer dielectric layer 22. At this moment, a photo-resist layer or a spin-on-glass (SOG) layer is coated on the entire surface including on the $Ti_{1-x}Hf_xN$ layer 24, and the photo-resist layer or the SOG layer is selectively removed in order to leave the photo-resist layer or the SOG layer in the storage node contact hole only. After that, the $Ti_{1-x}Hf_xN$ layer 24 is etched back or polished chemically and mechanically using the photo-resist or the SOG as an etch mask or an anti-polish layer until the surface of the inter-layer dielectric layer 22 is exposed.

Subsequently, an electrode layer 25 is formed on the entire surface including $Ti_{1-x}Hf_xN$ layer 24a which remains in the storage node contact hole. Here, the electrode layer 25 is formed of a noble metal such as platinum, iridium, and ruthenium, and the electrode layer may be formed of a conductive oxide, or a complex layer of a noble metal and a conductive oxide. The electrode layer 25 is deposited by a sputtering, CVD, or ALD method to a thickness of about 50 Å to about 2000 Å.

Here, the conductive oxides are $IrO_2$, $RuO_2$, $SrRuO_3$, $(Ba,Sr)RuO_3$, $(Sr,Ca)RuO_3$, $A_{1-x}Re_xBzO_3$ ($0 \leq x \leq 0.5$, $0 \leq y \leq 0.5$, $0.9 \leq z \leq 1.1$, A=Y, La; Re=Sr, Ca; B=Cr, Mn, Fe) or $La_{1-x}Sr_xCo_{1-y}Cr_yO_3$ ($0 \leq x \leq 0.5$, $0 \leq y \leq 0.5$).

Figure 2C:
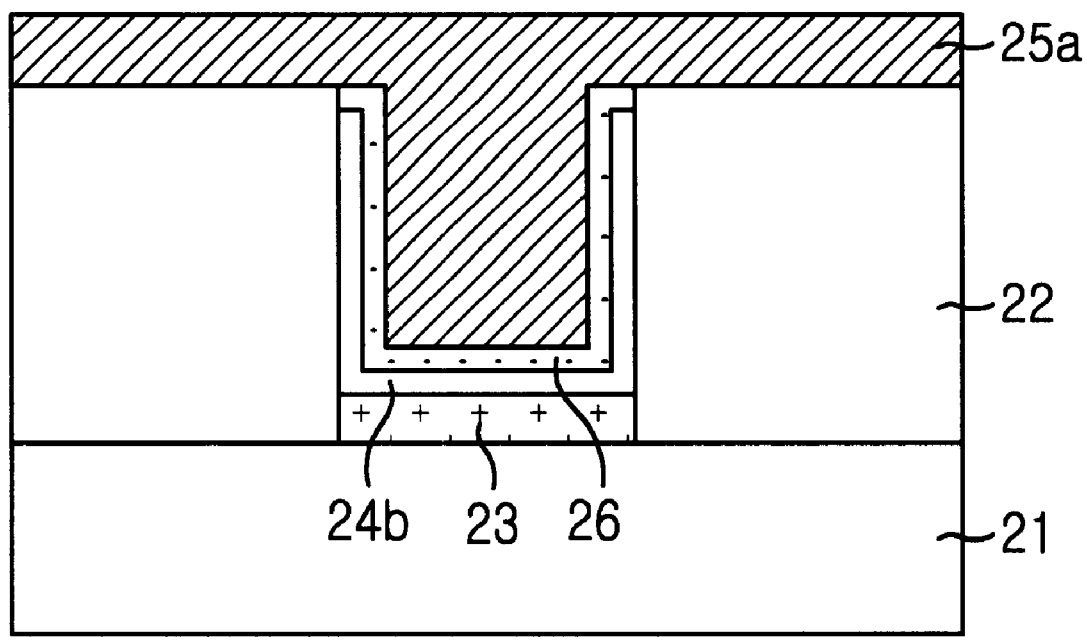

Referring to FIG. 2C, the substrate is thermally treated in an atmosphere containing a gaseous mixture of $O_2+N_2$ or $O_2+Ar$ at a temperature of about 400° C. to about 800° C. for about 10 seconds to about 10 minutes.

In a thermal treatment performed an $O_2$-containing gaseous atmosphere, the $Ti_{1-x}Hf_xN$ 24a is oxidized, thus forming a $HfO_2$ layer 26 to a thickness of about 50 Å to about 300 Å on the interface of the $Ti_{1-x}Hf_xN$ 24a and the electrode layer 25.

The non-reacted $Ti_{1-x}Hf_xN$ 24a that has not participated in the formation of the $HfO_2$ layer 26 is used as a bottom electrode 24b, and the thermally-treated electrode layer 25 is used as a top electrode 25a, the $HfO_2$ layer 26 being used as a dielectric layer of the capacitor.

Just as mentioned above, the $Ti_{1-x}Hf_xN$ layer 24a forms the $HfO_2$ layer 26 and the bottom electrode 24B. So, the $Ti_{1-x}Hf_xN$ layer 24a which is a storage node contact and anti-diffusion layer, is utilized as a bottom electrode 24b as well. Moreover, it simplifies a capacitor fabrication process by using the anti-diffusion $Ti_{1-x}Hf_xN$ layer 24a as a bottom electrode 24b, and forming a top electrode 25a on top of the $Ti_{1-x}Hf_xN$ layer 24a. That is, by forming only two layers (i.e., the $Ti_{1-x}Hf_xN$ layer 24 and the electrode layer 25) and performing a thermal treatment (unlike the conventional technology that forms the five layers of a titanium silicide/titanium nitride/bottom electrode/dielectric layer/top electrode in order), it is possible to simplify the fabrication procedure.

If the $Ti_{1-x}Hf_xN$ layer 24 is exposed in the $O_2$ atmosphere without an electrode layer thereon and oxidized, the surface reacts with $O_2$ so it becomes rough. Also, because the surface does not receive any compressive stress from outside, the $Ti_{1-x}Hf_xN$ layer 24 becomes swollen during the oxidation and forms fine cracks, thus inhibiting the obtainment of a quality $HfO_2$ as good as can be used for a dielectric layer.

Also, in the case of forming $HfO_2$ by the CVD method or the ALD method, a high-temperature thermal treatment is necessary to improve the quality of $HfO_2$ layer, because the oxidation reaction occurs at a low temperature. However, in an embodiment of the present invention, since the oxygen atom (O), which diffused through the electrode layer 25 on the $Ti_{1-x}Hf_xN$ layer 24a is made to react with the $Ti_{1-x}Hf_xN$ layer 24a, the reaction time is very fast. Also, covered with the electrode 25, the $Ti_{1-x}Hf_xN$ layer 24a receives compressive stress from it and the interface between the $HfO_2$ and the electrode layer 25 is smooth. Besides, with $HfO_2$ formed through a thermal treatment, the lattice mismatch is relieved as much as possible, and the amount of surface charges that adversely affects leakage current is minimized.

Extra nitrogen atoms (N) generated while the $HfO_2$ is formed resolve back into the $Ti_{1-x}Hf_xN$ layer 24a, so no void is generated between the $HfO_2$ layer 26 and the electric layer 25.

The capacitor formed in the above processes uses an electrode layer 25 as its top electrode 25A; non-reacted $Ti_{1-x}Hf_xN$ layer 24 as its bottom electrode 24A; and the reaction product $HfO_2$ layer 26 as its dielectric layer. A desired thickness of the dielectric layer can be obtained by controlling the temperature and time of a thermal treatment.

The oxide layer generated during the oxidation of $Ti_{1-x}Hf_xN$ is not a $TiO_2$ layer but a $HfO_2$ layer can be known by a thermodynamic observation.

Figure 3:
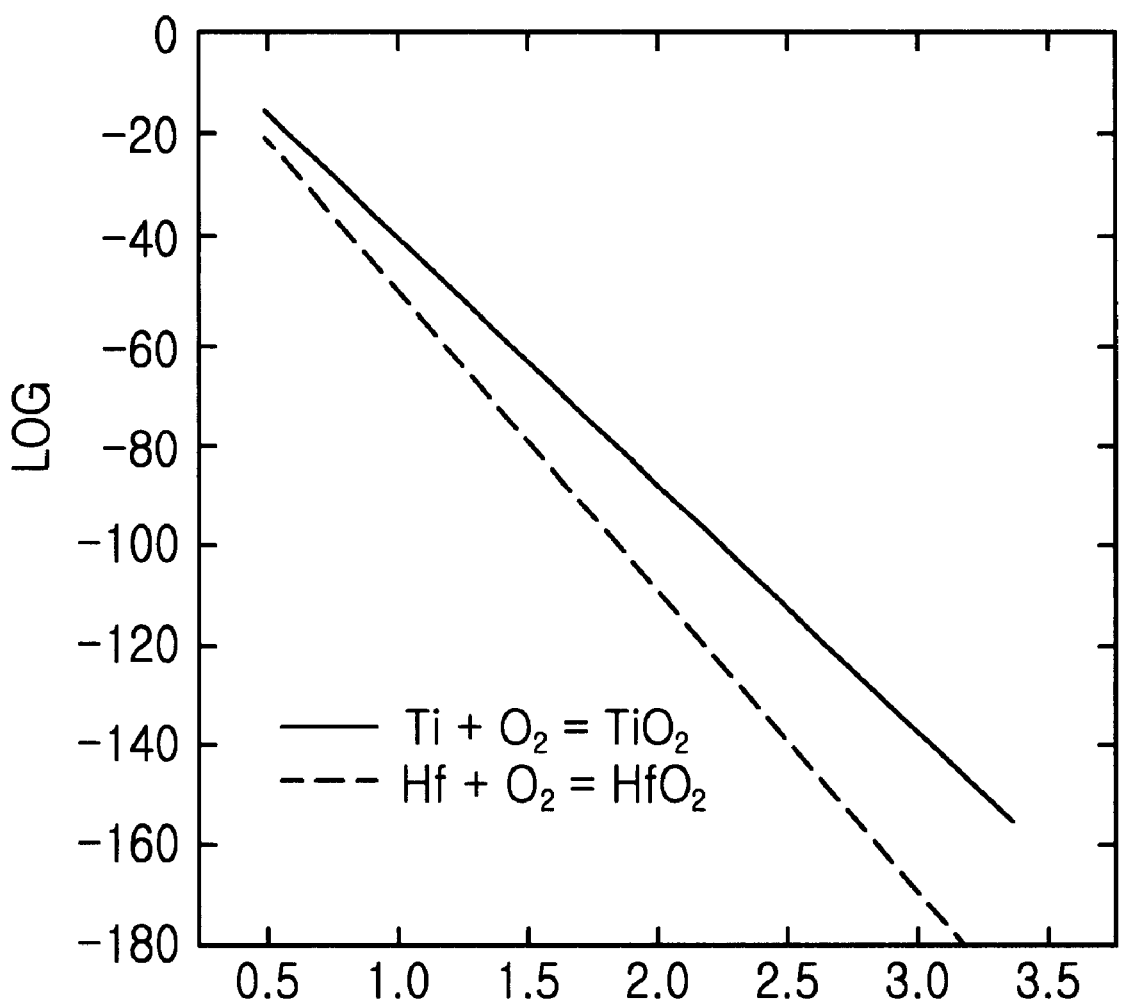

FIG. 3 is a graph showing the phase stability of $TiO_2$ and $HfO_2$.

With reference to FIG. 3, since the partial pressure of oxygen ($PO_2$) in the present of $Hf/HfO_2$ is lower than the partial pressure of oxygen ($PO_2$) in the present of $Ti/TiO_2$, $HfO_2$ is more stable than $TiO_2$ thermodynamically. Accordingly, when Hf and Ti are mixed and thermally treated in an oxygen atmosphere, Hf which is less stable thermodynamically, is oxidized faster than Ti because the oxidation potential of Hf is bigger than that of Ti.

Likewise, in case $Ti_{1-x}Hf_xN$ is oxidized, $HfO_2$ is more stable thermodynamically than the $TiO_2$ formed on the surface.

A sacrificial oxide layer for a bottom electrode need not he formed, because the bottom electrode is directly formed in the storage node contact hole by the present invention, thus simplifying the processes by lowering the deposition height of the capacitor as well as ensuring the alignment of depositions.

Also, this invention can obtain high quality of HfO2 and low leakage current by a solid reaction method through one-time thermal treatment with no need for a chemical vapor deposition (CVD) device or atomic layer deposition (ALD) device to form the $HfO_2$.

The present invention also simplifies the fabrication process as well by forming a $HfO_2$, bottom electrode, top electrode through one-time thermal treatment after depositing a $Ti_{1-x}Hf_xN$ and a conductive layer successively.

While the present invention has been described with respect to certain preferred embodiments, it will be apparent to those skilled in the art that various changes and modifications may be made without departing from the scope of the invention as defined in the following claims.

What is claimed is:

1. A method of fabricating a capacitor, the method comprising the steps of:
   (a) forming a $Ti_{1-x}Hf_xN$ layer on a substrate, wherein x is in a range from 0 to about 0.5;
   (b) forming an electrode layer on the $Ti_{1-x}Hf_xN$ layer; and
   (c) forming a $HfO_2$ layer on an interface between the electrode layer and the $Ti_{1-x}Hf_xN$ layer by performing a thermal treatment in an oxygen gas-containing atmosphere,
said capacitor comprising a bottom electrode formed from the $Ti_{1-x}Hf_xN$ layer, a dielectric layer is formed with the $HfO_2$ layer, and a top electrode formed from the electrode layer.

2. The method of claim 1, wherein the $HfO_2$ layer is formed to a thickness of about 50 Å to about 300 Å.

3. The method of claim 1, wherein the thermal treatment is performed in an atmosphere comprising a gas mixture of oxygen and nitrogen, or oxygen and argon.

4. The method of claim 1, wherein the thermal treatment is performed at a temperature of about 400° C. to about 800° C. for about 10 seconds to 10 minutes.

5. The method of claim 1, wherein the $Ti_{1-x}Hf_xN$ layer is formed by sputtering, chemical vapor deposition (CVD), or atomic layer deposition (ALD).

6. The method of claim 1, wherein the $Ti_{1-x}Hf_xN$ layer is formed to a thickness of about 100 Å to about 300 Å.

7. The method of claim 1, wherein the $Ti_{1-x}Hf_xN$ layer is formed by chemical vapor deposition (CVD) or atomic layer deposition (ALD) said method further comprising the step of gradually increasing a molar fraction of Hf relative to TiN to $Ti_{0.5}Hf_{0.5}N$.

8. A method of fabricating a capacitor, the method comprising the steps of:
   (a) forming an inter-layer dielectric layer on a silicon semiconductor substrate;
   (b) forming a contact hole by selectively etching the inter-layer dielectric layer to expose the surface of the semiconductor substrate;
   (c) forming a $Ti_{1-x}Hf_xN$ layer in the contact hole, wherein x is in a range from 0 to about 0.5;
   (d) forming an electrode layer on the $Ti_{1-x}Hf_xN$ layer; and
   (e) forming a $HfO_2$ layer on an interface between the electrode layer and the $Ti_{1-x}Hf_xN$ layer by performing a thermal treatment in an oxygen gas-containing atmosphere,
said capacitor comprising a bottom electrode formed from the $Ti_{1-x}Hf_xN$ layer, a dielectric layer formed from the $HfO_2$ layer, and a top electrode formed from the electrode layer.

9. The method of claim 8, further comprising the step of forming an ohmic contact layer between the semiconductor layer and the $Ti_{1-x}Hf_xN$ layer.

10. The method of claim 8, wherein the $HfO_2$ layer is formed to a thickness of about 50 Å to about 300 Å.

11. The method of claim 8, wherein the thermal treatment is performed in an atmosphere comprising a gas mixture of oxygen and nitrogen, or oxygen and argon.

12. The method of claim 8, wherein the thermal treatment is performed at a temperature of about 400° C. to about 800° C. for about 10 seconds to about 10 minutes.

13. The method of claim 8, wherein the $Ti_{1-x}Hf_xN$ layer is formed by sputtering, chemical vapor deposition (CVD), or atomic layer deposition (ALD).

14. The method of claim 13, wherein the $Ti_{1-x}Hf_xN$ layer is formed to a thickness of about 100 Å to about 300 Å.

15. The method of claim 8, wherein $Ti_{1-x}Hf_xN$ layer is formed by chemical vapor deposition (CVD) or atomic layer deposition (ALD), said method further comprising the step of gradually increasing a molar fraction of Hf relative to TiN to $Ti_{0.5}Hf_{0.5}N$.

16. The method of claim 8, wherein step (c) comprises the steps of:
   (i) forming an anti-polish layer or an etch mask on the $Ti_{1-x}Hf_xN$ layer in the contact hole; and
   (ii) applying a chemical mechanical polish or an etch-back process to the $Ti_{1-x}Hf_xN$ layer until the surface of the inter-layer dielectric layer is exposed.

17. The method of claim 16, wherein the anti-polish layer or the etch mask is formed of photoresist or spin-on-glass.

* * * * *